United States Patent [19]

Bowver, Jr. et al.

[11] Patent Number: 4,642,873

[45] Date of Patent: Feb. 17, 1987

[54] APPARATUS FOR CUTTING AND STUFFING WIRES INTO CONNECTOR CONTACTS

[75] Inventors: Hadley H. Bower, Jr., Oklahoma City; Ernest F. Kulka, Bethany, both of Okla.

[73] Assignee: AT&T Technologies, Inc., Berkeley Heights, N.J.

[21] Appl. No.: 547,532

[22] Filed: Oct. 31, 1983

[51] Int. Cl.[4] .......... H05K 13/06

[52] U.S. Cl. .......... 29/566.3; 29/749; 29/760

[58] Field of Search .......... 29/566.3, 749, 721, 29/564.2, 33 M, 760, 850, 566.2

[56] References Cited

U.S. PATENT DOCUMENTS

| | | | |
|---|---|---|---|
| 4,048,710 | 9/1977 | Nijman | 29/760 X |
| 4,461,061 | 7/1984 | Rock | 29/33 M |
| 4,499,648 | 2/1985 | Brown et al. | 29/564.2 |

*Primary Examiner*—Z. R. Bilinsky

*Attorney, Agent, or Firm*—Peter Visserman; M. dePicciotto

[57] ABSTRACT

A pair of connectors (10 and 11) having insulation piercing terminations or contacts (14, 15, 16 and 17) arrayed in columns and rows and strain relief grooves (18 and 19) associated with designated terminations in each column are stepped relative to a pair of wire cutting and stuffing devices (58 and 59) to present successive columns of terminations to receive wires. Following the presentation of each pair of columns of terminations, the wire cutting and stuffing devices are shifted by cam track devices (85, 86, 136 and 137) to position the cutting and stuffing devices to insert wires in the terminations in the designated rows of terminations. As the cutting and stuffing devices are shifted, wire guides (108 and 109) are positioned to lay the wires in designated strain relief grooves associated with the respective terminations. Each wire is cut by the wire cutting device at a point closely adjacent to the termination receiving a wire.

17 Claims, 12 Drawing Figures

FIG. 3
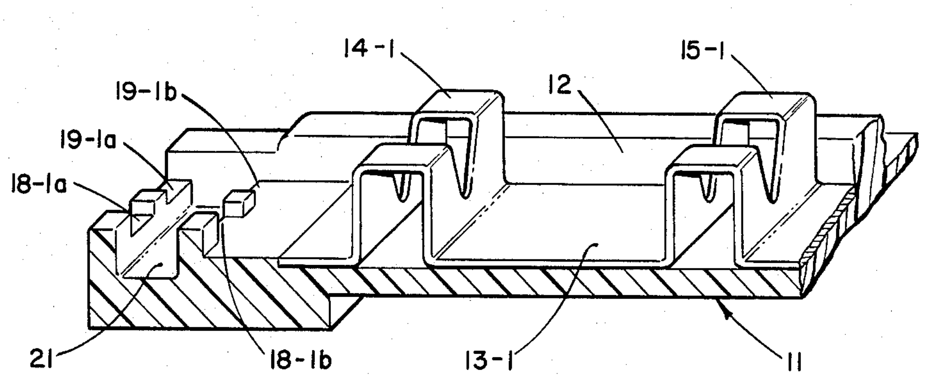
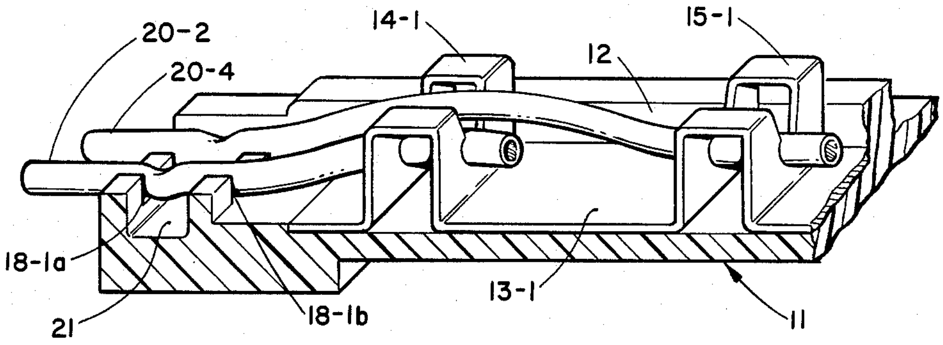
FIG. 4

8
56
63
62
64
68
60
67

59
58
76
9
61
84
85
101
86
9
81
97
83
92
112
67
70
111
113
69
119
10
10
128
118
66
117
29
116
20-1
20-2
20-2
132
109
115
114
20-1
30
36
8

APPARATUS FOR CUTTING AND STUFFING WIRES INTO CONNECTOR CONTACTS

FIELD OF THE INVENTION

This invention relates to apparatus for cutting and stuffing insulated wires in a coordinate array of insulation piercing contacts or terminations mounted in an electrical device such as a connector, and further features facilities for laying sections of the wires in appropriate strain relief slots formed in the connector and associated with individual contacts.

BACKGROUND OF THE INVENTION

In the manufacture of various electrical devices, there is frequently a need to terminate a number of insulated wires to insulation piercing contacts arranged in rows and/or columns within the device. Concomitant with the terminations of the wires, there is an added requirement that the wires be placed in strain relief notches formed in the electrical device. One such electrical device is a connector widely used in the telephone industry to interconnect cable wires with banks of terminal pins arranged in a backplane of telephone switching equipment.

A number of tools and apparatus have been developed for inserting insulated wires into a connector, wherein each wire is pushed into an insulation piercing termination element and into a strain relief slot formed in a housing of the connector. For example, in U.S. Pat. No. 3,959,868, issued July 1, 1976 to I. Mathe, there is shown an insertion tool which includes a blade or group of blades, each having a first section for pushing an insulated wire into a pair of aligned insulation piercing termination elements, a second section, narrower than the first, for pushing the wire into a strain relief slot, and a bifurcated section at the end of the blade for guiding the wire into the strain relief slot.

In other semi-automatic wire insertion machines, such as disclosed in U.S. Pat. No. 3,995,358, issued Dec. 7, 1976 to R. A. Long et al., pairs of wires are simultaneously sheared and inserted into insulation piercing terminations mounted on opposite sides of a connector. In use of this particular machine an attending operator grasps a pair of insulated cable wires and moves the wires beneath a pair of alignment flippers and then against a pair of switch actuators which are moved to operate a pair of switches. Operation of both switches initiates movement of a pair of oppositely disposed insertion blades that control through an interconnected mechanism, the pivoting of the flippers to push the wires against reference surfaces and into alignment with the ends of the insertion blades and the oppositely disposed pair of insulation piercing terminations. Further movement of the insertion blades act to shear and then insert the wires into the pair of aligned insulation piercing terminations.

There is still a need for a machine for inserting insulated wires into insulation piercing terminations arrayed in columns and rows in a connector and for inserting sections of the wires in strain relief notches which are laterally offset with respect to each of the columns of insulation piercing terminations. Further, such a machine should possess the capability of shearing the wires at different points in accordance with the particular row of terminals in which the wires are inserted.

SUMMARY OF THE INVENTION

This invention contemplates, among other things, a wire insertion machine for shearing and inserting insulated wires in insulation piercing terminations arrayed in columns and rows within a connector or other electrical device while inserting the wires in strain relief grooves formed in the connector and located in positions offset from the columns of contacts.

More particularly, the apparatus of the invention features programmed controlled facilities for automatically stepping a pair of connectors relative to a load position to present successive columns of pairs of insulation piercing terminations to receive insulated wires. In use an attending operator grasps a first pair of wires and moves the wires through wire guides into positions overlaying the columns of terminations and into positions to actuate a pair of control switches which function to initiate the movement of a pair of insertion blade devices to insert the wires in the first terminations in the first columns of the respective connectors. At this time, the wire guides are positioned to guide sections of the wires into first strain relief grooves formed in the respective connectors and associated with the first terminations. The blade devices are positioned and moved, at this time, to insert the wire into appropriate strain relief grooves and to sever the wires at locations closely associated with the terminations in which the wires are inserted.

Following this first insertion operation, the wire insertion devices are shifted to overlay the second terminations in the first columns and the wire guides are shifted to overlay second strain reliefs in the respective connectors and associated with the second terminations. The blade devices are moved down for a second time and the second wires are inserted in the second strain reliefs and the second terminations while the wires are severed at locations closely adjacent to the second terminations.

Next, at the start of the third cycle of operations of the apparatus, a stepping motor is operated to move the connectors to present the second columns of terminations to the load positions. The third pairs of wires are placed to operate the control switches, and the blade devices, now overlaying terminations in the second columns but in rows displaced from the terminations in first columns, move to insert the wires in the third terminations. At this time, the wire guides are shifted so that the wires are inserted in strain reliefs associated with the third terminations. Again, the wires are sheared at points closely adjacent to the third terminations.

During the fourth cycle of operation of the apparatus, the blade devices are initially shifted to overlay the fourth terminations which are in rows different than the rows in the first column. Again, the wire guides are shifted to overlay strain reliefs associated with the fourth terminations. The blade devices are thereafter moved to insert the wires in the fourth strain reliefs and the fourth terminations while the wires are sheared at points closely adjacent to the fourth terminations. The machine is subsequently operated to repeat the pattern of wire insertions until all designated terminations in the connector receive wires.

DESCRIPTION OF THE DRAWING

Other advantages and features of the invention will be apparent upon consideration of the following detailed description in conjunction with the accompanying drawing wherein:

FIG. 3 is a perspective view of a pair of terminations arranged in a column and a pair of associated strain reliefs;

FIG. 4 is a perspective view of the terminations shown in FIG. 3 with a pair of wires inserted therein and extending to run through the pair of strain reliefs associated with the terminations;

DETAILED DESCRIPTION

Figure 1:
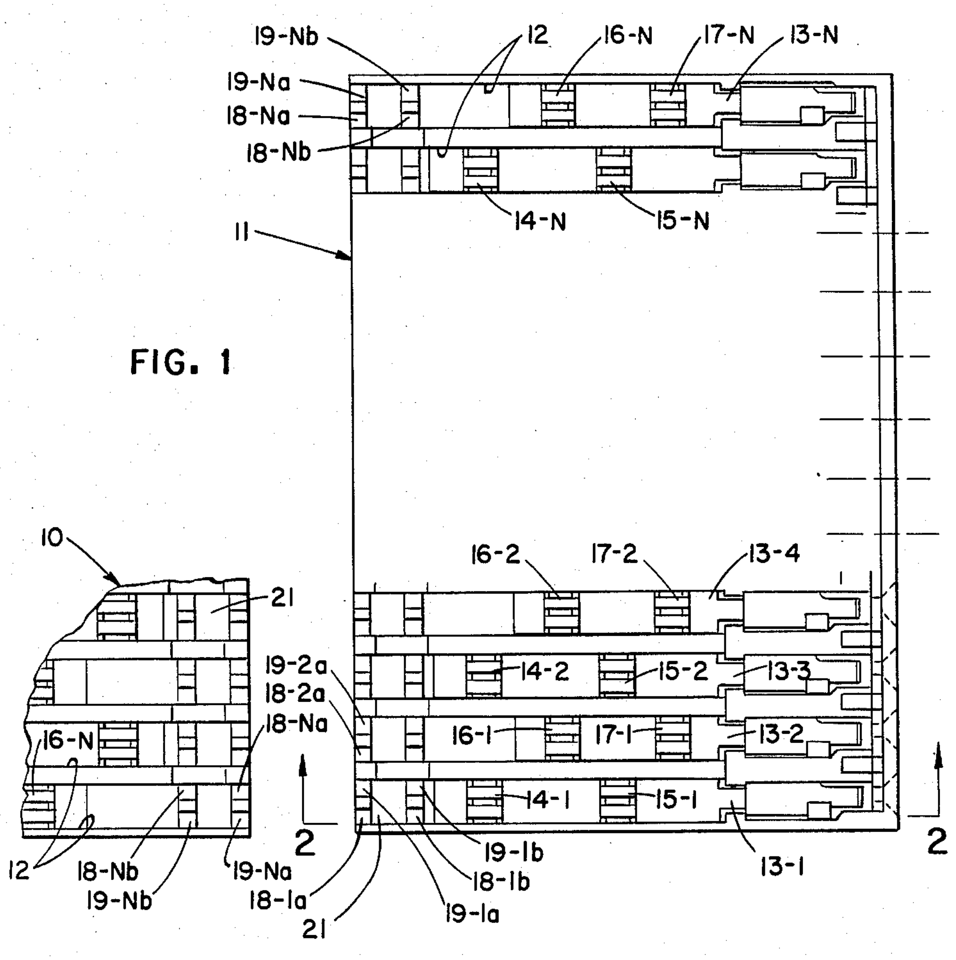
FIG. 1 is a view of two connectors having rows and columns of insulation piercing terminations into which insulated wires may be inserted by the apparatus of the present invention.
Figure 2:
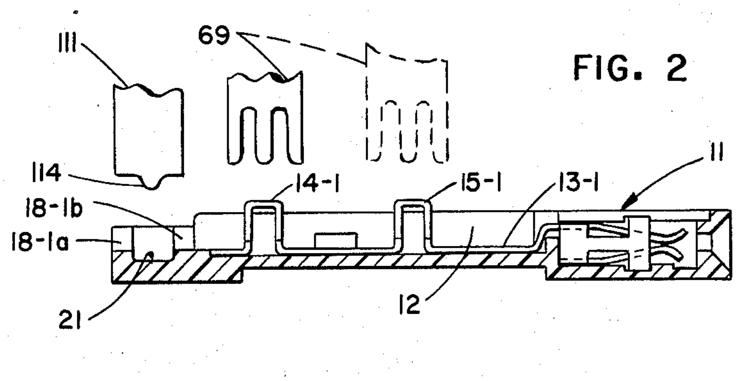
FIG. 2 is a sectional view taken along line 2—2 of FIG. 1 showing a pair of insulation piercing terminations and one strain relief for one of the wires inserted in one of the terminations together with a showing of a pair of wire insertion blades.

The apparatus disclosed in the drawing is designed to insert pairs of insulated wires in a pair of connectors 10 and 11. In the described application of the invention, the connectors are actually connector halves which are subsequently abutted together to form an unitary connector. Referring to FIGS. 1, 2, 3 and 4, it will be noted that each connector or connector half 10 or 11 is formed with channels 12 in which are mounted terminals 13-1, 13-2, 13-3, etc. Alternate terminals such as 13-1 and 13-3 are formed with a pair of insulation piercing contacts or terminations 14 and 15, while the other intervening terminals, such as 13-2 and 13-4, are formed with insulation piercing contacts or terminations 16 and 17. Individual insulation piercing contacts are fabricated by forming bights in the terminals and slotting the bights (see particularly FIGS. 3 and 4) to provide insulation cutting edges which are capable of piercing the insulation on wires 20 pressed into the slots.

Each pair of contacts on a terminal may be considered to be mounted in the column. First, contacts 14-1 and 14-2 on alternate terminals, such as 13-1 and 13-3, are positioned in the first row, while contacts 16 on the intervening terminals, such as 13-2 and 13-4, are mounted in the second row, contacts 15 are mounted in the third row, and contacts 17 are mounted in the fourth row. A left hand section of the connector 11 is formed with pairs of spaced, strain relief edge slots or grooves **18-1*a*, 18-1*b*, 18-2*a*, 18-2*b*, etc., and 19-1*a*, 19-1*b*, 19-2*a* and 19-2*b*, etc., associated with each terminal 13 for receiving the wires 20 running to the pair of insulation piercing contacts on each terminal. Each aligned pair of strain relief slots, such as slots 18-1*a* and 18-1*b*, is laterally offset with respect to a center line running through an associated terminal, such as terminal 13-1, so that each pair of slots may be considered associated with one designated termination, such as termination 14-1. The connector is formed with a transverse channel 21 into which the wires 20 are depressed and dimpled to form slack sections between the sections of the respective strain reliefs 18-1*a* and 18-1*b* to relieve strain in the end section of a wire secured to the associated contact, such as contact 14-1 on terminal 13-1**.

Figure 5:
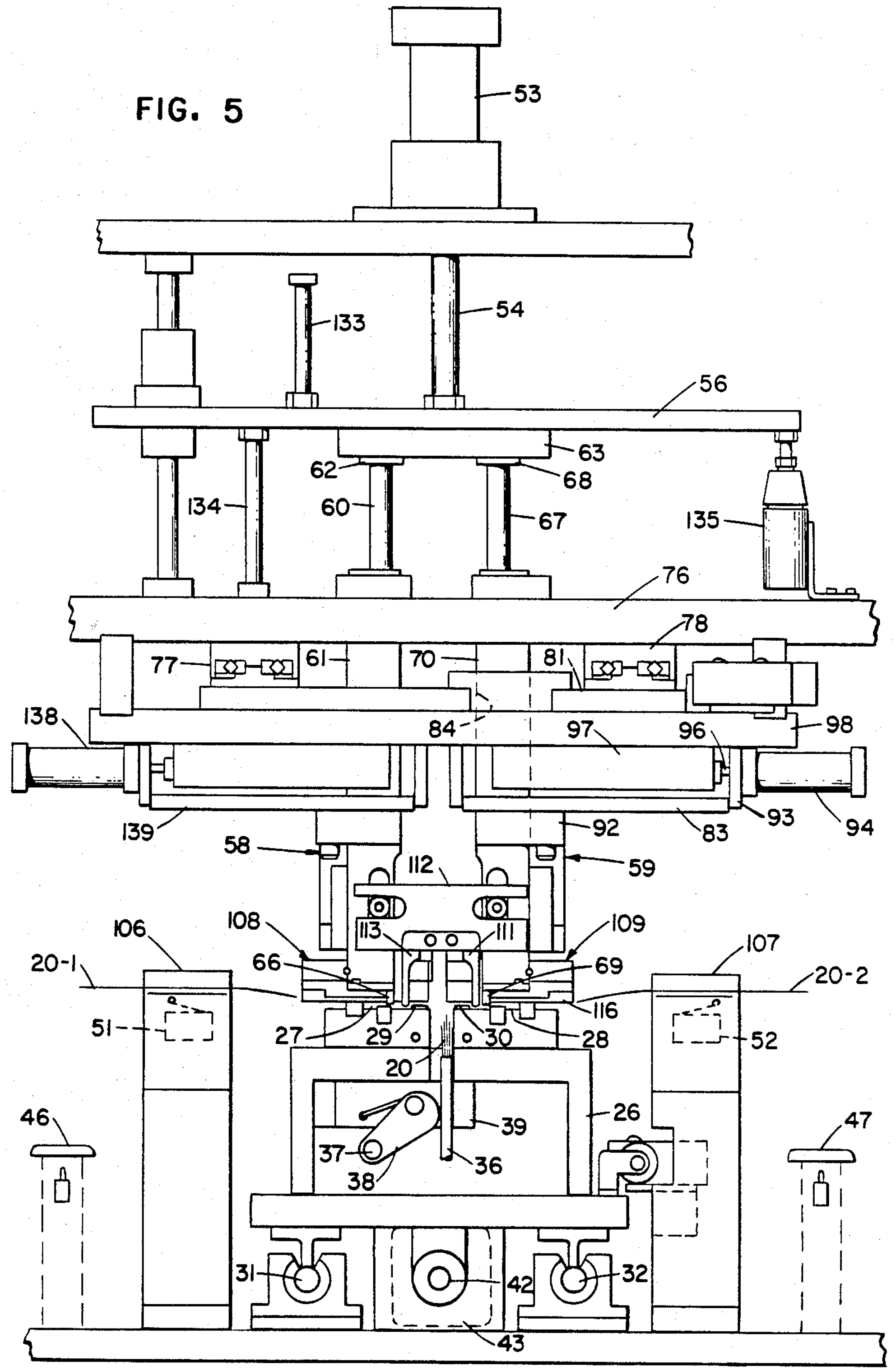
FIG. 5 is a front elevational view of an apparatus for inserting successive pairs of wires in the terminations and the associated strain reliefs embodying the principles of the present invention.
Figure 6:
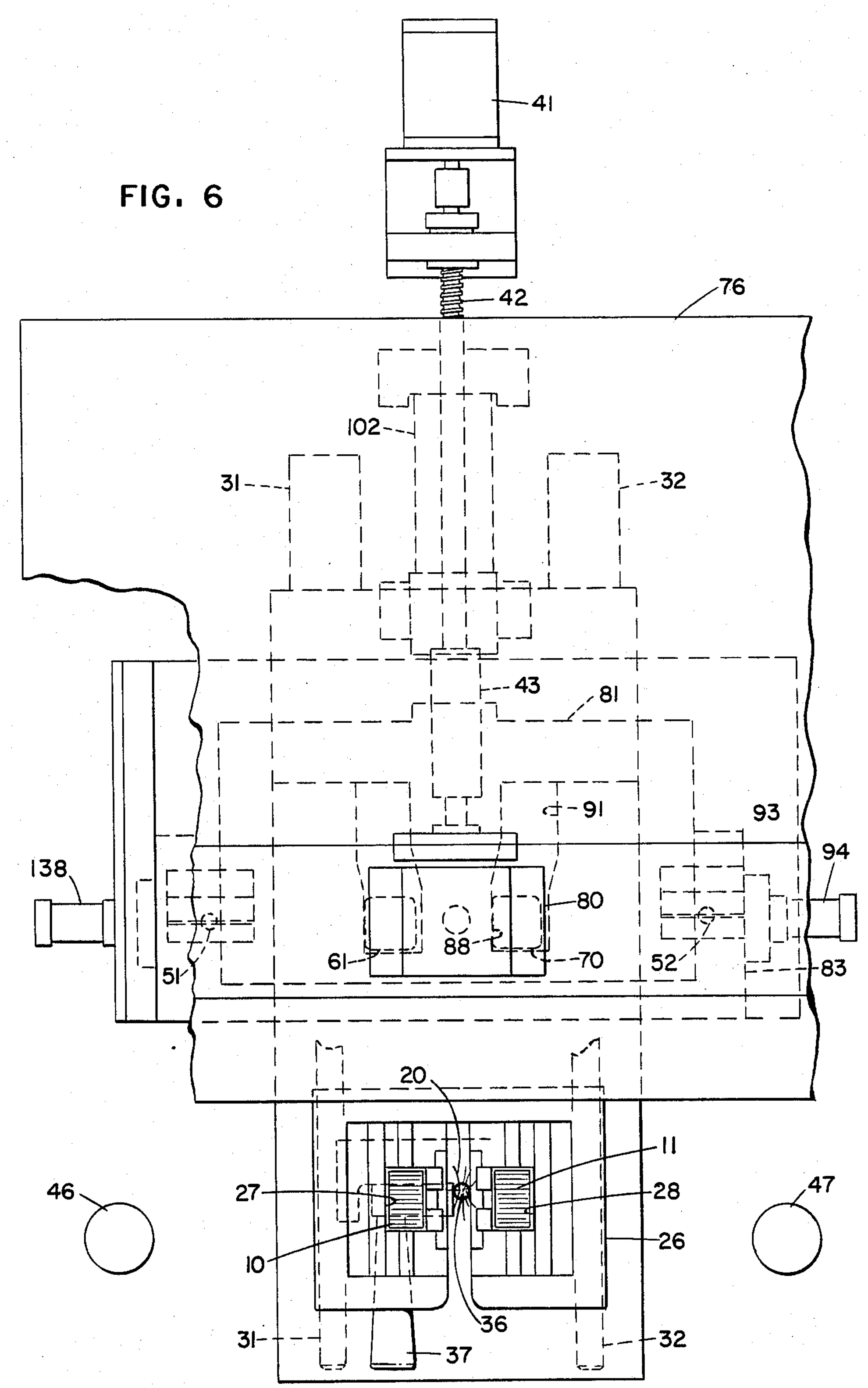
FIG. 6 is a top view of the apparatus showing a slideable workholder table in the withdrawn or load and unload position.
Figure 7:
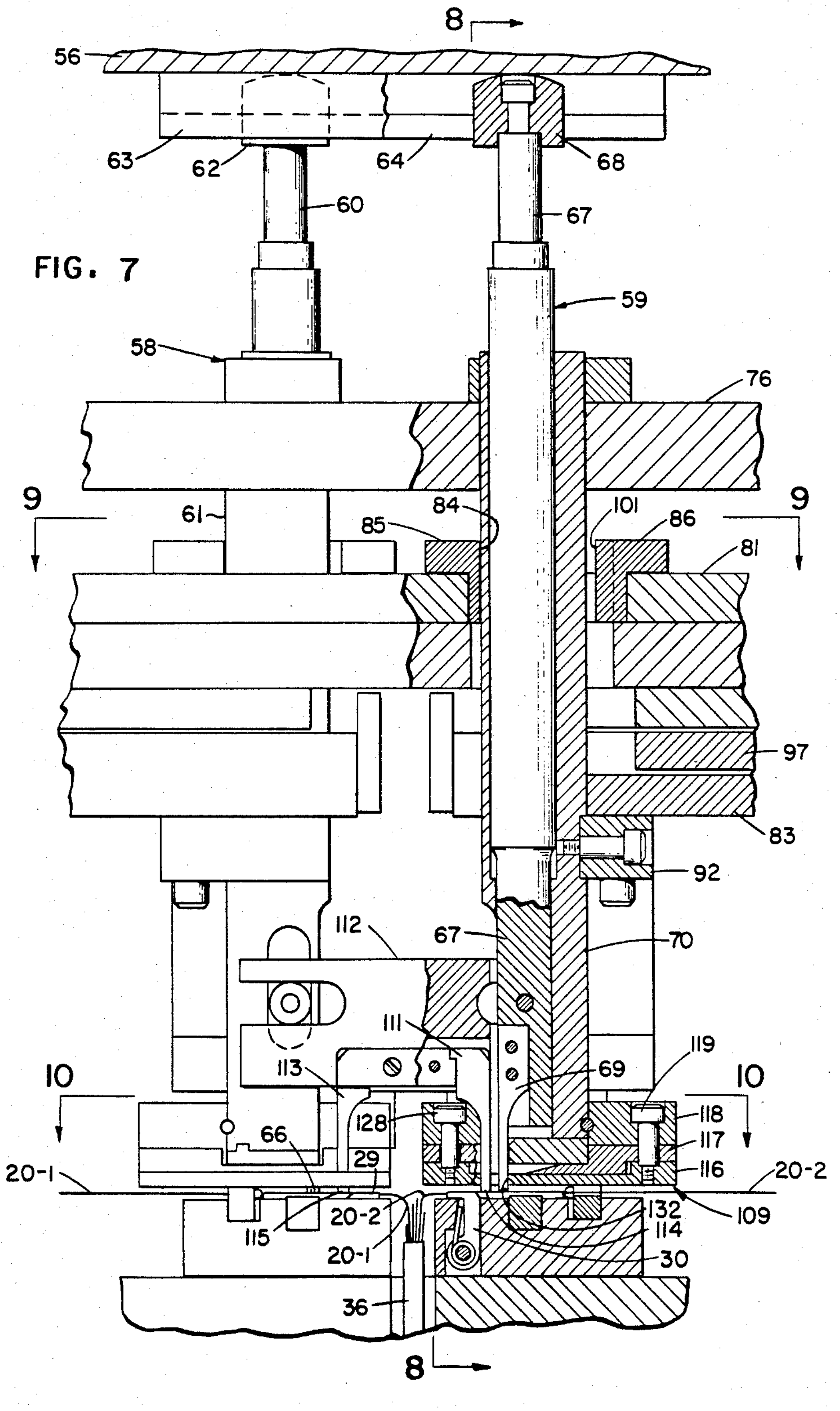
FIG. 7 is an enlarged view partially cut away to show the details of construction of one of a pair of wire insertion mechanisms in an operated position for inserting one wire in a termination and a strain relief and for shearing the wire adjacent to the termination.
Figure 8:
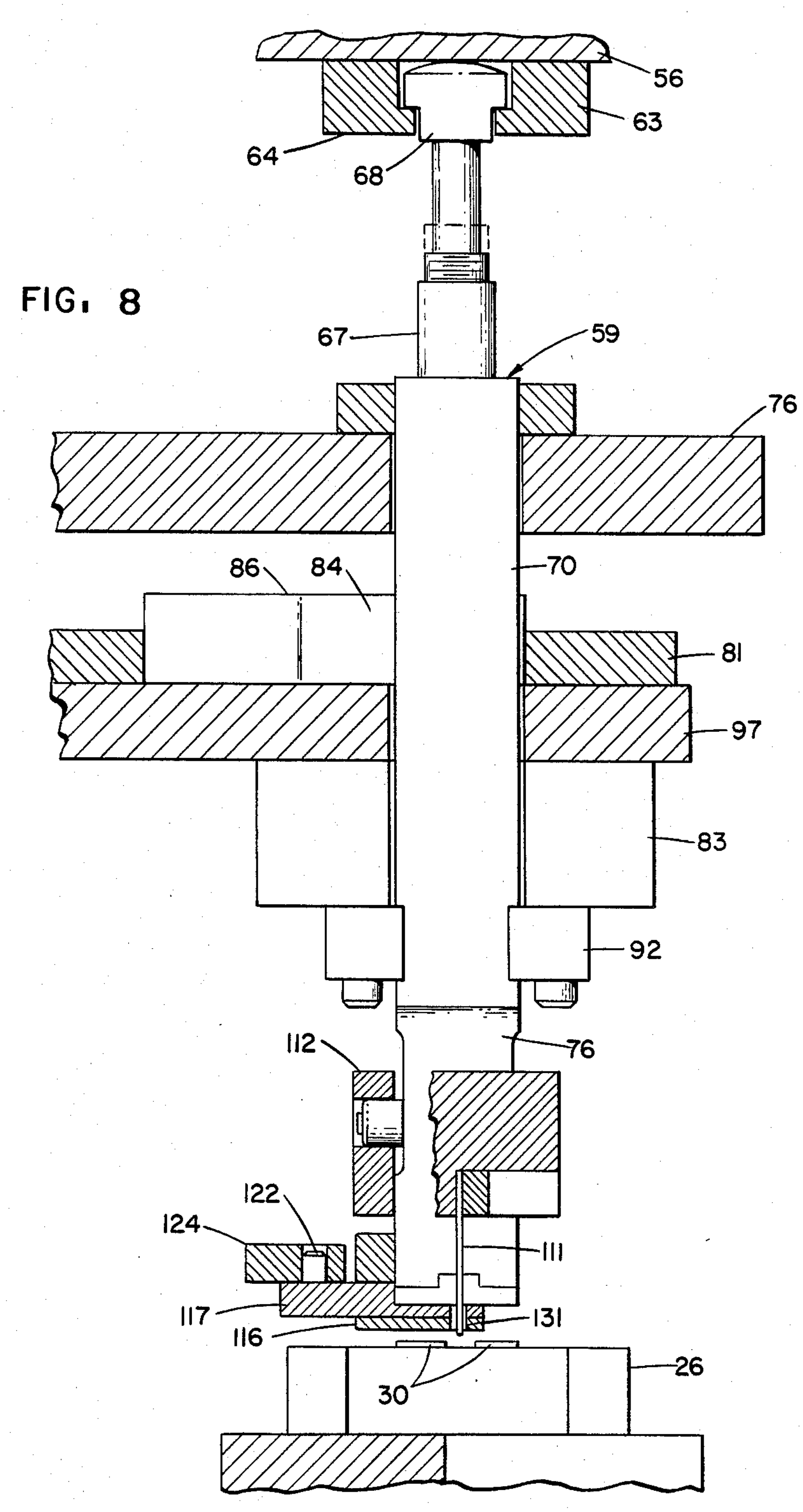
FIG. 8 is a sectional view taken along line 8—8 of FIG. 7 showing a mounting for the wire insertion mechanism whereby a wire insertion blade may be moved up and down in four different paths to insert wires in different rows of a coordinate array of wire insulation piercing terminations or contacts.

Referring to FIGS. 5 and 6 of the drawing, there is shown a loading table slide 26 in a withdrawn position having a pair of nests 27 and 28 to receive a pair of connectors 10 and 11. For purposes of clarity of illustrating the structure of the apparatus, the connectors 10 and 11 are not shown in nests 27 and 28 in FIGS. 5, 7 and 8. Pairs of spring urged pushers 29 and 30 (see also FIG. 7) are provided to push against the fronts of the connectors to seat and hold the connectors in the nests. The table slide is mounted on a pair of linear ball-bearing devices 31 and 32 so that the slide 26 may be moved from a load position to a position within the apparatus where the wires are cut and stuffed into terminal contacts. As best shown in FIG. 5 of the drawing, a cable 36 composed of a number of pairs of color-coded wires 20 is secured on the table slide by operation of a handle 37 of spring loaded eccentric clamp 38 which holds the cable against a back plate 39. The table is moved from the load position into the apparatus by operation of a stepping motor 41 (see FIG. 6) which drives a screw 42 that turns in a nut 43 secured to the underside of the slide table 26. The sequential operation of the various component mechanisms and stepping motor is under the control of a commercial programmer device, such as Model 8300 Bandit-Computer numerical controlled, manufactured by Summit Div. Dana Corp. of Bozeman, Mont.

In general, an attending operator will load the cable 36 and a pair of connectors 10 and 11 on the slide table 26 and then operate a pair of electrically interlocked safety palm buttons 46 and 47 to initiate a cycle of operation of the apparatus whereupon the slide table is moved into the machine. With the connectors advanced and positioned within the machine, the attending operator selects and grasps two color-coded wires 20-1 and 20-2 and stretches the wires laterally of the machine to overlay, engage and operate a pair of sensors 51 and 52. With both sensors operated and the wires held so that the operator's hands are clear of the machine, an air cylinder 53 (see FIG. 5) is automatically operated to advance a piston rod 54 that moves a cross head 56 downwardly to operate a pair of selectively positioned, wire guide, cut and stuff devices 58 and 59 that function to insert the pair of wires into appropriate pairs of strain relief slots, such as strain relief slots 18-1*a* and 18-1*b*. Immediately thereupon, the wires are cut and stuffed in a first pair contacts, such as contact 14-1, formed in the pair of connectors 10 and 11. Following a stuffing of the first pair of wires, the air cylinder 53 is reversed and the stuffing facilities are set to insert the next pair of wires in the next pair of contacts, such as 15-1, formed in the respective connectors. The operator selects and grasps the next pair of color-coded wires 20-3 and 20-4, stretches the wires over the sensors 51 and 52 to operate the stuffing devices to insert the wires in strain reliefs, such as strain relief slots 19-1*a* and 19-1*b*, and in the second contacts, such as contact 15-1, on the first terminals, such as terminal 13-1.

Prior to the next or third cycle of programmed operation of wire stuffing devices, the stepping motor 41 is operated to move the slide table 26 and the connectors 10 and 11 to position the next sets of contacts, such as 16-1 and 17-1 on the terminals 13-2, to receive wires. Upon subsequent cyclic operation of the machine and insertion of wires in all the connector contacts, the slide table 26 is returned to the load position for removal of the wired connectors.

As mentioned, the means for inserting the pair of wires include a first and a second pair of severing and stuffing devices generally designated 58 and 59. The insertion devices are substantially identical in structure and function, and hence much of the subsequent detail description will be directed to the second stuffing device 59. However, it will be noted that the first device 58 comprises a rod 60 slideably mounted in a shiftable housing 61 and attached to a first coupling slide 62 mounted to move along a pair of gibs 63 and 64 (see also FIGS. 7 & 8) secured to cross head 56. Attached to the lower end of the rod 60 is a blade 66 for severing and then stuffing wires into connector 10 positioned in next 27.

Considering the second severing and stuffing device 59 in detail, it comprises a rod 67 attached at its upper end to a second coupling slide 68 mounted to move between and along the gibs 63 and 64. Secured to the lower end of the rod 67 is a blade 69 for severing and stuffing wires into the connector 11. The rod 67 is slideably mounted in a housing 70 and is cyclically reciprocated to insert each wire in a termination in the connector. The housing 70 is selectively positioned between reciprocations in four different termination (contact) row positions. Inasmuch as the housing 70 and rod 67 are attached to the coupling slide 68 which is slideably mounted between the gibs, the housing may be shifted laterally to move the blade 69 into four positions to insert wires in the different rows in which the terminations 14, 15, 16 and 17 appear.

Figure 9:
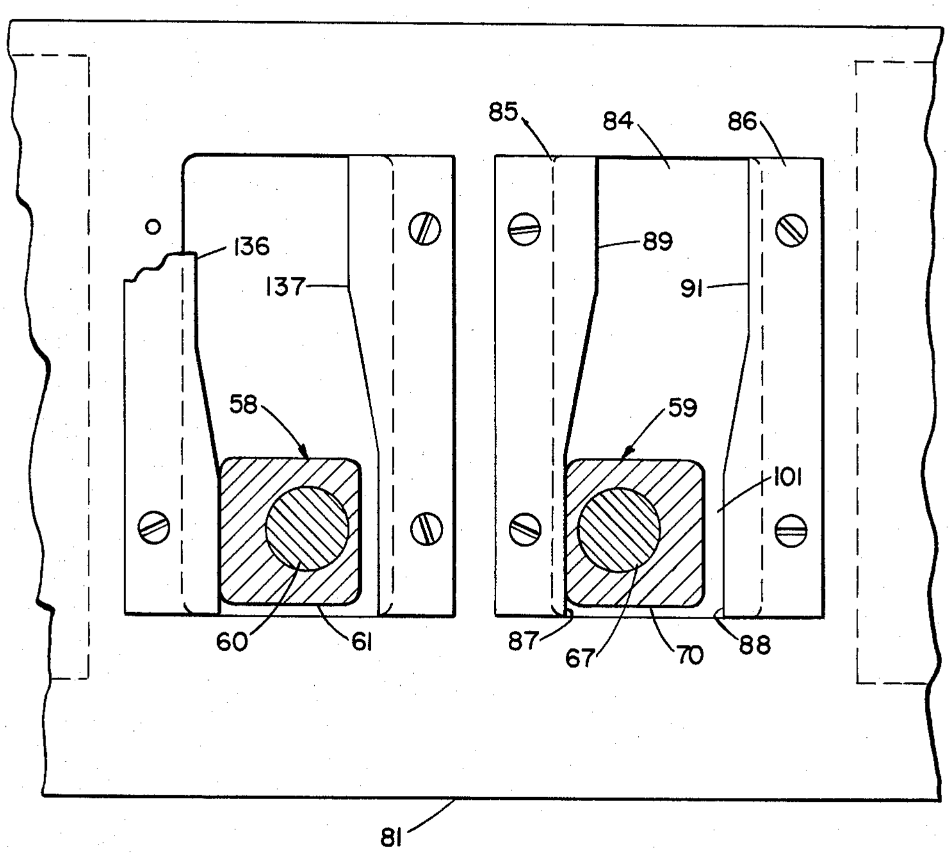
FIG. 9 is a sectional view taken along line 9—9 of FIG. 7 showing a camming structure for selectively positioning the insertion blades in four different coordinate positions.

Selective positioning of the blade 69 relative to the contacts 14–17 in different rows is attained by shifting the housing 70. Secured to the underside of a stationary frame member 76 are a pair of slideways 77 and 78 for mounting a first cam or positioning slide 81. The actual finite positioning of the housing 70 is controlled by the movement of the first cam slide 81 and a second positioning slide 83. More specifically, the housing 70 extends through an opening 84 formed in the slide 81. As shown in FIG. 9, the opening 84 is bounded by a pair of cam tracks 85 and 86 having cam surfaces 87, 88, 89, and 91.

The second positioning slide 83 is secured by a mounting flange unit 92 to the housing 70. Slide 83 (see FIG. 5) is secured to a bracket 93 on which is mounted on air cylinder 94 having a piston rod 96 extending through an aperture in the bracket and bearing against a fixed frame member 97 secured to a mounting plate 98. When air cylinder 94 is operated, the thrust placed on the piston rod 96 causes a reaction force to be exerted on the air cylinder, thus shifting the air cylinder to the right along with the slide 83, the housing 70 and hence the blade 69 of the stuffing device 59.

Referring again to FIGS. 5 and 9 and considering the shifting of the stuffing device 59 into four different row positions, it will be noted that there is a gap 101 between the right hand wall of housing 70 and the cam surface 88. During the insertion of the first wire 20 in contact 14-1, the housing 70 of stuffing device 59 is abutted against cam surface 87. At the start of the next or second cycle, the slide 81 is thrust forward by operation of an air cylinder 102 (see FIG. 6) so that the cam plate slide 81 moves forward, and the cam surface 89 engages the left wall of housing 70 to shift housing 70 to the right.

During the next or third succeeding cycles, the air cylinder 102 is not operated (retracted) and the air cylinder 94 is operated so that the positioning slide 83 shifts to the right and the housing 70 is moved against the cam surface 88. Following this cycle, a subsequent or fourth cycle is initiated, and both of the air cylinders 94 and 102 are operated so that the right-hand surface of the housing 70 is abutted against the cam track surface 91. It will be thus appreciated that the housing 70 can be selectively positioned in any one of four row positions to align the blade 69 with the designated rows of contacts 14-17 of the connector 11.

Briefly, recapitulating on the actual sequence of operations of the air cylinders 94 and 102 during the four cycles of the insertion means required to stuff wires in the contacts or terminations 14-1 and 15-1 on the terminal 13-1 and the contacts or terminations 16-1 and 17-1 on terminal 13-2 of connector half 11, the first stuffing operation occurs with the air cylinder 94 in an unoperated (retracted) state and the air cylinder 102 in a unoperated (retracted) state. With a wire overlaying the contact 14-1, the air cylinder 53 moves the cross head 56 to move the blade 69 of the second stuffing device 59 to insert the wire in the first contact 14-1. Upon completion of the first stuffing operation, and the return of the cross head 56 to the up position, the air cylinder 102 is operated to the forward state to shift the slide 81 forward while the air cylinder 94 is held in the unoperated (retracted) state so that the housing 70 is positioned by the cam surface 89. The second stuffing operation pushes a positioned wire 20-4 into contact 15-1, and thereafter the cross head 56 is returned to the up position, whereupon the air cylinder 102 is placed in the unoperated (retracted) state to return the slide 81 to the initial position and the air cylinder 94 is operated to the forward state thus shifting the slide 83 to move the housing 70 against cam surface 88.

At this time, the stepping motor 41 operates to index the table slide 26 to position the next column of terminations or contacts 16-1 and 17-1 on terminal 13-2 in position to receive a pair of wires. The third stuffing operation is thereupon initiated and a wire is stuffed in contact 16-1 whereafter the cross head 56 is again returned to the up position. At this time, the air cylinder 102 is operated (forward state) and the air cylinder 94 is operated to forward state to further shift the housing 70 toward the right against the cam surface 91, thereby positioning the housing over the fourth contact 17-1. The fourth stuffing operation is then executed and, upon return of the cross head 56 to the up position, the air cylinder 94 is restored to an unoperated (retracted) state and the air cylinder 102 is restored to an unoperated (retracted) state in anticipation of another repetitive cycle to stuff wires into the next coordinate array of contacts 14-2, 15-2, 16-2 and 17-2.

It may be appreciated that each successive group of four wires are stuffed in contacts arranged in a coordinate array consisting of two different column positions and four different row positions. The subsequent operation of the machine repeats this array of insertions until all the contacts are stuffed with wires. The second wire stuffing device 58 is operated simultaneously with the first wire stuffing device 59 to stuff four wires into the connector 10. With the cam arrangement shown in FIG. 9, the stuffing of wires into connector 10 commences with the stuffing of a wire into contact 16-N because the connector 10 is in a rotated 180° or reverse position with respect to connector 11.

When the operator stretches a first pair of wires 20-1 and 20-2, the wires are moved (see FIG. 5) along surfaces of a first pair of stationary wire guides 106 and 107 to engage the sensors 51 and 52, whereafter the wires are moved through a second pair of shiftable first and second wire guides generally designated by the reference numerals 108 and 109 (see FIGS. 5, 7, 10, 11 and 12). Considering the second wire guide 109 (FIGS. 10, 11 and 12) which is a mirror image and identical in structure to the first wire guide 108, it may be shifted into two positions to lay the wires into the strain relief grooves 18-1 and 19-1 respectively associated with the contacts 14-1 and 15-1 on terminal 13-1.

During each wire insertion operation, a wire such as wire 20-2 is pushed and dimpled into the connector channel 21 by a second blade 111 (see FIGS. 5 and 7) secured to an intervening slotted yoke and pin structure 112 that is connected to move up and down with the rods 60 and 67 attached to the cross head 56. In a like manner, there is a second strain relief insertion blade 113 secured to the yoke structure 112 that moves to insert wires in the strain relief grooves formed in connector 10. It is will be noted from FIGS. 2 and 7 that the lower ends of the blades 111 and 113 and nubs 114 and 115 (see FIG. 11) formed thereon project beyond the lower extremities of the cut and stuff blades 66 and 69. More specifically, when the cross head 56 is moved downwardly during a first wire insertion operation, the blade 111 with the projecting nub 114 moves downwardly to push a section of the wire into the connector channel 21 to form a dimple in the wire while pushing the wire into the first pair of strain relief grooves **18-1*a* and 18-1*b*. As the dimple is formed and the wire is inserted in the strain relief grooves 18-1*a* and 18-1*b*, the continued movement of the cut and stuff blade 69 functions to cut the wire against an edge of a shear plate 116 (see FIG. 7) and immediately, thereafter, the cut wire is pushed into the first insulating piercing contact 14-1**.

The strain relief wire guide 109 (see FIGS. 7, 10, 11 and 12) is attached to the housing 70 and thus moves when the housing is shifted to the four discrete wire insertion positions. This wire guide includes a shiftable wire guide plate 117 which is pivotally mounted on a support plate 118 by a shoulder bolt 119. The support plate 118 is secured to and shifts with the housing 70. The guide plate 117 is provided with a narrow wire receiving slot 120 extending into a wide section 121 aligned with the second wire push and dimple blade 111 and through which this blade moves to seat a wire in a strain relief groove. During the first and third stuffing operations, the movement of the housing 70 is limited so that the guide plate 117 is held from a pivoting and the wire guide 109 is positioned to guide the stuffed first and third wires in the strain relief grooves **18-1*a* and 18-2*a***.

Figure 10:
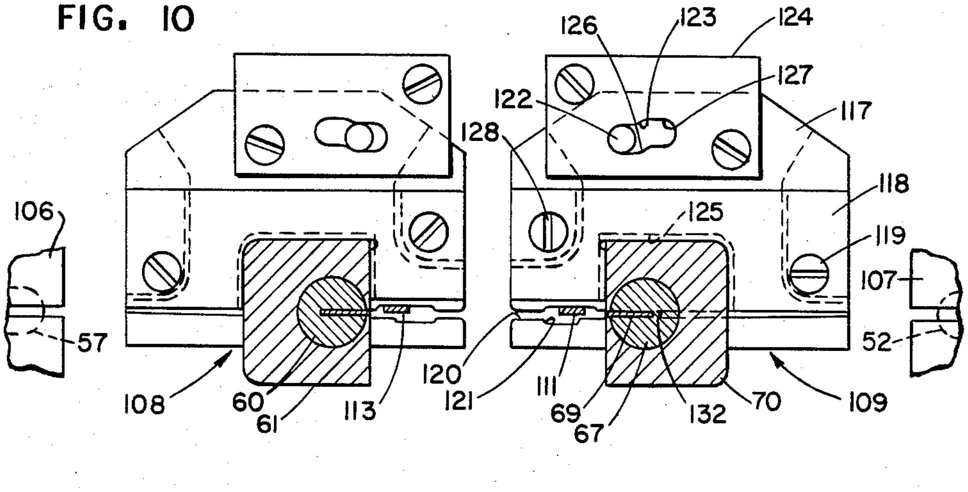
FIG. 10 is a sectional view taken along line 10—10 of FIG. 7 showing a pair of movable guides for selectively positioning wires to be terminated in alignment with designated strain reliefs.
Figure 11:
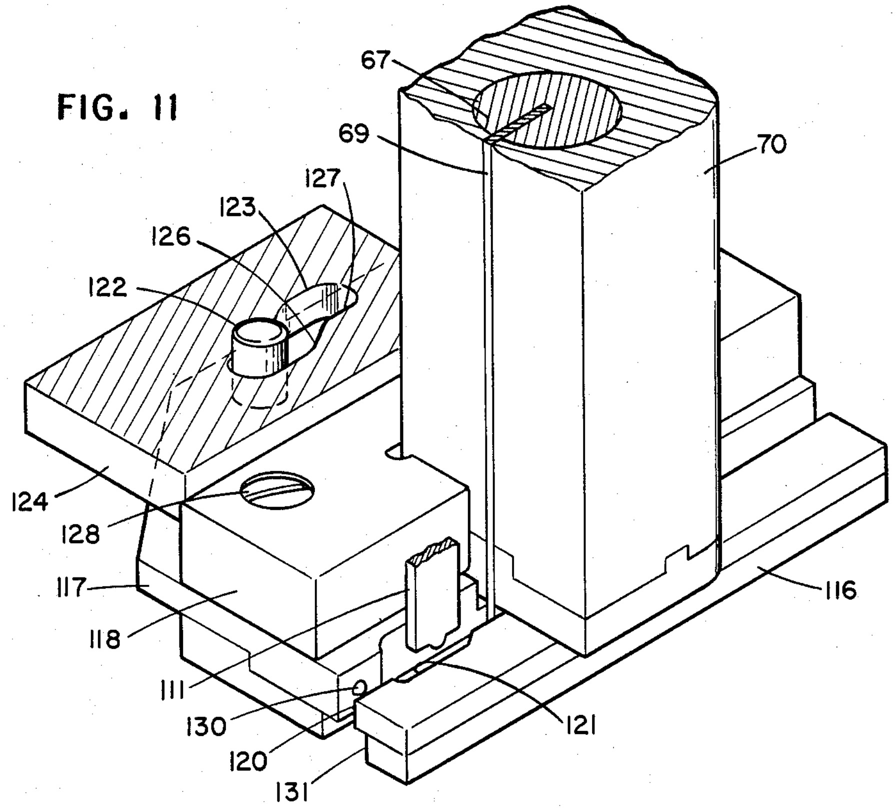
FIG. 11 is a perspective view of one of the movable wire guides and a camming arrangement for selectively positioning the guide to overlay a designated strain relief associated with a particular insulation piercing termination.
Figure 12:
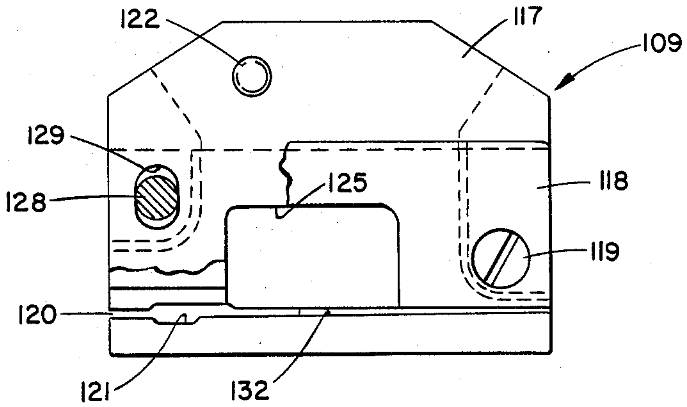
FIG. 12 is a top view of a wire guide with the blade structure and a cam plate removed to illustrate more clearly the structure of a wire guide for positioning a wire to overlay a strain relief groove formed in the connector.

When the housing 70 is shifted to the right for the second and fourth wire insertion operations, there is a significant rightward movement whereupon the wire guide plate 117 moves a cam stud 122 in a cam slot 123 formed in a plate 124 fixed to the machine housing. There is a small amount of clearance between the housing 70 and a cut-out 125 formed in the wire guide plate 117 to permit a limited amount of rotation of the plate 117 relative to the housing 70. The rightward or lateral shifting movement of the housing 70, in anticipation of the stuffing of the second wire in contact 15-1, moves the plate 117 with the cam stud 122 to the right a sufficient amount, causing the stud to ride up from an inner level 126 to an outer level 127 of the cam slot 123, thus pivoting the plate 117 in a clockwise direction, as shown in FIGS. 10, 11 and 12 about the pivot shoulder bolt 119. The wire guide 109 is thus moved into a position with the narrow slot 120 of the wire guide plate 117 in alignment with the strain relief grooves **19-1*a* and 19-1*b* so that the second wire is pushed by the blade 111 into these strain relief grooves. The shear plate 116 is also secured to the housing 70 by the shoulder bolt 119 and a stud bolt 128 which are both seated in the support plate 118. A spring loaded plunger 130 with a bullet nose tip may be mounted in plate 117 to temporarily retain the wire until the blade 111 engages and positively pushes the wire into the strain relief grooves. The stud bolt 128 extends through an elongated slot 129 (see FIG. 12) formed in the shiftable wire guide plate 117 thereby permitting the wire guide plate to pivot relative to the support plate 118. The shear plate 116 is provided with a relatively wide slot 131 (see FIG. 11) to permit the unimpeded passage of the wires into the appropriate strain relief grooves. This slot 131 terminates in the plate 116 to form a shearing edge 132 (see also FIG. 7) against which the blade 69** pushes and shears each wire at a section closely adjacent to the designated termination in which a wire is seated.

When the third wire is to be inserted in the connector 11, the strain relief wire guide 109 is moved back to the first position to insert the third wire in the strain relief grooves **18-2*a* and 18-2*b* associated with the contact 16-1 on terminal 13-2. More specifically, when the housing 70 is positioned against the cam track section 88, there is sufficient, net leftward movement of the plates 117 and 118 and the cam stud 122 so that the stud 122 moves from the outer cam slot level 127 back into inner slot level 126 thus causing the plate 117 to pivot about shoulder bolt 119 back into the initial position with the slot 120 of the wire guide plate 117 positioned in alignment with the first strain relief grooves 18-2*a* and 18-2*b* associated with the contact 16-1 on the terminal 13-2**.

SUMMARY OF OPERATION

In summary of the overall operation, with the cross head 56 in the up position and the loading table slide 26 in the forward position, the attending operator loads a pair of connectors 10 and 11 in the nests 27 and 28. A sheathed or other cable 36 is secured in place by the clamp 38 and the loose unsheathed sections of wires 20 are generally spread. The operator depresses the two palm buttons 46 and 47 to initiate the operation of the stepping motor 41 which acts to move the table slide 26 into the machine. At this time, the blade housing 70 of stuffing device 59 is initially positioned as shown in FIG. 9 against cam surface 87 because the air cylinders 102 and 94 are not operated. The second wire guide 109 is positioned to lay a wire in the strain relief grooves 18-1*a* and 18-1*b* of connector 11. Also, at this time, the stuffing device 58 is positioned as shown in FIG. 9 and the first wire guide 108 is positioned to lay a wire in the first strain relief grooves 19-Na and 19-Nb of connector 10.

The operator selects and grasps two of the color-coded wires associated with the first terminations or contacts 16-N and 14-1 on the two first terminals of the respective connectors 10 and 11. The wires are drawn through the wire guides 106 and 107 (see FIG. 5) and moved into engagement. with the sensors 51 and 52. Operation of both sensors causes air cylinders 53 (see FIG. 5) to move the piston rod 54 downwardly to advance the cross head 56 and the two stuffing devices 58 and 59 toward the wires. The extent of reciprocating motion of the cross head 56 is set by a pair of adjustable stop members 133 and 134 and the reversal of the movement of the cross head 56 is controlled by a limit switch 135. Blades 113 and 111 with the projecting nubs 115 and 114 act to push the wires into the transverse channels 21 of the individual connectors 10 and 11 while the wires are pushed by the blades into the strain relief grooves, such as grooves 18-1*a* and 18-1*b*. Concomitant therewith, the wires are pushed by the stuffing blades 66 and 69 past the shearing plates, such as plate 116, to shear the wires and stuff them into the first insulation piercing contacts 16-N and 14-1 in the respective connectors.

The cross head 56 is elevated by reversal of the air cylinder 53, whereafter the air cylinder 102 is operated to shift slide 81 forward so that cam surface 89 moves the housing 70 and the blade 69 into position to shear and stuff the next wires 20 into second insulation piercing contacts, such as contact 15-1. At this time, a cam track 136-137 associated with the first stuffing device 58 positions the device 58 to insert a wire 20 into a second insulation piercing contact in the connector 10.

The operator grasps the next two color-coded wires 20 and presses the wires through the wire guide members 106 and 107 to again operate sensors 51 and 52 to initiate the next or second cut and stuff cycle of operation. The wires are also moved into the strain relief wire guide slots, such as slot 120, of the respective the wire guides 108 and 109. Considering the second wire guide 109, it will be remembered that the slide 83 and the housing 70 are shifted to the right by operation of the air cylinder 102, hence, the housing 70 shifts the wire guide plate 117 to the right so that the stud 122 reacts in being moved from level 126 to level 127 in the cam slot 123 to pivot the plate 117 of the wire guide 109 into alignment with the second strain relief grooves 19-1*a* and 19-1*b* associated with the second contact 15-1 on the first terminal 13-1. The first wire guide 108 is constructed in a similar fashion and cooperates with the housing 61 of the first cut and stuff device 58 to position wire guide 108 to lay the wires into the appropriate strain relief grooves formed in the connector 10. The second wires are laid in the proper strain relief grooves and are then severed and stuffed into the second contacts, such as contacts 15-1, of the respective connectors 10 and 11.

At the time that the second insertion cycle is completed and the cross head 56 is withdrawn, the stepping motor 41 is operated to index the table 26 to position the second column of contacts 16 and 17 in the respective connectors 10 and 11 to receive the third and fourth sets or pair of wires. Upon return of the cross head 56 to the up position, the second wire cut and stuff device 59 is positioned by a return of the slide 81 to the initial position and the operation of air cylinder 94 to shift the slide 83 so that the housing 70 is abutted against cam surface 88 of cam track 86 in anticipation of the insertion of a wire of the third pair of wires 20 into contact 16-1. The first cut and stuff device 58 is positioned by the cam track 136-137 for the insertion of a wire in the third contact in connector 10 by the retraction of the slide 81 in conjunction with the operation of an air cylinder 138 and a slide 139, which are similar in structure and function to the air cylinder 94 and slide 83. With the cut and stuff devies 58 and 59 positioned by the cams, such as cam 88, the respective wire guides 108 and 109 are returned to the initial position to lay the third pair of wires in the strain relief grooves associated with the third contact. The air cylinder 53 is again operated to move the blades 113 and 111 down to insert the wires in the strain reliefs, such as strain reliefs 18-2*a* and 18-2*b*, whereafter the blades 66 and 69 cut and stuff the wires in insulation piercing contacts, such as contact 16-1, of the individual connectors 10 and 11.

Upon return of the cross head 56 to the up position, the air cylinder 102 operates to shift the slide 81 forward and air cylinder 94 is effective to shift slide 83 to the right thus moving the housing 70 into engagement with the cam surface 91. In a similar way, the first cut and stuff device 58 is shifted with respect to connector half 10. The blades 66 and 69 of the individual cut and stuff devices 58 and 59 are now positioned to insert wires into the fourth row of contacts, such as insulation piercing contact 17-1, formed in the terminals, such as terminal 13-2, mounted in the respective connectors 10 and 11. In this instance, the wire guides 108 and 109 are rotated to position the guide members to lay the fourth pair of wires in the strain reliefs, such as strain relief grooves 19-2*a* and 19-2*b*, formed in the respective connectors 10 and 11. The air cylinder 53 is then again operated to move the cross head 56 downwardly to advance the strain relief insertion blades 113 and 111 and the wire insertion blades 66 and 69 to insert the fourth pair of wires in the strain relief grooves and insulation piercing contacts.

During each subsequent four cycles of operations of the machine, the pattern of wire insertions is repeated until wires are inserted in all contacts. Upon completion of all of the wire insertion operations, the cross head 56 is elevated and the stepping motor 41 is operated to move the table 26 back to the load position where the attending operator removes the wired connectors 10 and 11.

It will be understood that the cyclic operation of the apparatus is under the control of a programmed device, and thus by varying the program, the sequence of operations may be changed. As an example, the individual terminals may have only single contacts or terminations, in which situation the steps required to position the housings 58 and 59 for the insertion of wires into the second terminations on each terminal may be eliminated. Other patterns of rows and columns of terminations may be accommodated by changing the programmed operations. Further, it may be desired to only wire a portion of the terminations, in which case the apparatus may be programmed to skip the positioning of selected terminations in the wiring position.

What is claimed is:

1. An apparatus for inserting wires in insulation piercing terminations and in strain relief grooves mounted in an electrical device wherein the terminations are positioned in a coordinate array of rows and columns with a pair of grooves associated with each one of the terminations, the apparatus comprising:

a movable wire guide for receiving a wire;

a housing including a first blade slideably mounted therein for engaging and inserting each wire into one of the insulation piercing terminations;

a holder for supporting the electrical device;

means for moving said holder to align successive columns of terminations with said first blade;

means rendered effective following each movement of the holder for shifting the housing into positions to overlay the first blade with each termination in successive rows of terminations in the aligned column of terminations;

means operated by the shifting of the housing for moving the wire guide into positions to overlay the pair of strain relief grooves associated with each successive row termination in the aligned column of terminations;

means for actuating said first blade overlaying a termination in a row position to insert a wire in the overlaid termination; and a second blade moved with the first blade for inserting a portion of the wire positioned in the wire guide into the overlaid pair of strain relief grooves.

2. An apparatus as defined in claim 1 wherein said actuating means includes means for reciprocating said first blade in said housing to engage and insert a wire in a termination.

3. An apparatus as defined in claim 2 wherein said shifting means include:

cam tracks having surfaces for engaging said housing to shift said first blade in different row positions; and means rendered effective upon completion of each reciprocation of said first blade for moving said housing into engagement with another cam surface.

4. An apparatus as defined in claim 3 wherein said cam tracks are contoured to move the housing and first blade into different row positions following each movement of the holder to align a successive column of terminations with said first blade.

5. An apparatus as defined in claim 3, which comprises:

a first slide for mounting said cam tracks with a first track spaced from a second track;

a second slide for mounting said housing to extend between said first and second cam tracks; and means for moving said second slide to engage said housing with said first cam track and then said second cam track.

6. An apparatus as defined in claim 1 which comprises:

a wire sensor located to be operated by the positioning of a wire in overlaying relation to a column of terminations aligned with said first blade for controlling the operation of said first blade actuating means.

7. An apparatus as defined in claim 2, which includes:

a shearing member mounted on said housing and having a shearing edge cooperable with said first blade for shearing a wire closely adjacent to the termination in which the wire is inserted.

8. An apparatus as defined in claim 1, which includes:

a pivotal mounting for movably mounting said wire guide on said housing to pivot from a first position in alignment with first strain relief grooves to a second position in alignment with the next successive strain relief grooves associated with a column of terminations; and a cam and follower interposed between the blade housing and the wire guide for pivoting the wire guide upon each shifting of the blade housing.

9. An apparatus for inserting wires in terminations arrayed in columns and rows in an electrical device including strain relief grooves associated with each termination, the apparatus comprising:

a housing having a first blade slideably mounted therein;

means for shifting said housing into different row positions of the array to align the first blade with terminations in the rows of terminations;

means for holding the electrical device with a termination in a first column aligned with said first blade;

means for moving said holding means to present successive columns of terminations to said first blade;

a pivotally mounted wire guide means for receiving and guiding wires;

means for sliding said first blade toward and away from the holding means and the electrical device to insert a wire in an aligned termination;

means rendered effective upon completion of each movement of said first blade away from a termination for operating said shifting means to move the housing to align the first blade with a termination in another row in the same aligned column;

means rendered effective by each shifting of the housing for pivoting said wire guide means to overlay a wire and the strain relief grooves associated with the termination receiving the wire;

a second blade moved with the first blade for inserting the wire positioned in the wire guiding means into the overlaid strain relief grooves; and means rendered effective upon a predetermined number of sliding movements of said first blade for moving the holding means to present a successive column of terminations to said first blade.

10. An apparatus as defined in claim 9 wherein said housing shifting means includes:

a camming means having a first pair of straight cam surfaces spaced from a second pair of straight cam surfaces, said first and second pairs of cam surfaces being spaced apart a distance sufficient to receive the housing for movement therebetween;

a first slide for mounting said camming means; and a second slide secured to said housing; and said operating means includes:

means for moving said second slide to move said housing from engagement with said first pair of cam surfaces into engagement with said second pair of cam surfaces; and means for moving said first slide to engage said first pair of straight cam surfaces with said housing when the housing is in engagement with one of said first cam surfaces or for moving said first slide to engage said second pair of straight cam surfaces with said housing when the housing is in engagement with one of said second cam surfaces.

11. An apparatus as defined in claim 9 wherein said pivoting means includes:

a stationary plate having a cam surface; and a cam follower mounted on said wire guide means and positioned to engage said stationary plate cam surface for pivoting said wire guide means when said housing is shifted into different row positions.

12. An apparatus as defined in claim 9 which includes:

a shear plate secured to said housing and cooperable with said first blade for shearing a wire adjacent to a termination in which a wire is inserted.

13. An apparatus for inserting a pair of wires in an electrical device having a pair of wire seating terminations aligned in a column and a pair of wire receiving grooves that are laterally offset to the center line of said pair of terminations, which comprise:

means for holding the electrical device;

a housing including a first blade slideably mounted therein and projecting therefrom;

means for initially locating said housing in a first insertion position to align said first blade with a first of the terminations;

a wire guide movably mounted on said housing and having a wire guiding slot;

means for initially positioning said wire guide with the wire guiding slot in alignment with a first of said wire receiving grooves;

means rendered effective by positioning a first wire through said wire guiding slot for sliding said first blade to insert the first wire in the first termination;

a second blade moved with the first blade for engaging and inserting the first wire into the first of said wire receiving grooves;

means for shifting said housing to a second insertion position to align said first blade with a second of the terminations; and means rendered effective upon the shifting of said housing to insert the second wire of the pair of wires in the second of the terminations for moving said wire guide to position its wire guiding slot in alignment with the second of said wire receiving grooves.

14. An apparatus as defined in claim 13 which includes:

a cam having a first surface for initially positioning said housing to insert the first wire in the first termination, and having a second surface for subsequently positioning said housing to insert the second wire in the second termination; and means for sliding the cam and the cam surfaces to move the housing from the first termination insertion position to the second termination insertion position.

15. An apparatus as defined in claim 13, wherein said wire guide includes:

a support plate secured to said blade housing;

a wire guide plate having said wire guiding slot formed therein; and means for pivotally mounting said wire guide plate on said support plate.

16. An apparatus as defined in claim 15 wherein said wire guide pivoting means comprises:

a cam follower pin projecting from said wire guide plate; and a stationary plate having a cam trackway for receiving said cam follower pin, said trackway having a first section for initially locating said wire guide plate to overlay the first of the wire receiviing grooves and second section reacting against said cam follower pin when said housing is shifted for pivoting the wire guide to overlay the second of said wire receiving grooves.

17. An apparatus as defined in claim 13 further comprising a shearing member mounted to shift with said insertion blade housing and having a shearing slot therein aligned with said wire guiding slot, said sheąring slot terminating in a shearing edge cooperatable with said first blade for shearing a wire prior to insertion in a wire receiving termination.

* * * * *